(12) United States Patent
Yee et al.

(10) Patent No.: US 8,252,629 B2
(45) Date of Patent: Aug. 28, 2012

(54) METHOD FOR MAKING A STACKABLE PACKAGE

(75) Inventors: Kuo-Chung Yee, Kaohsiung (TW); Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 50 days.

(21) Appl. No.: 12/856,401

(22) Filed: Aug. 13, 2010

(65) Prior Publication Data
US 2011/0159639 A1    Jun. 30, 2011

(30) Foreign Application Priority Data
Dec. 31, 2009    (TW) ................ 98146111 A

(51) Int. Cl.
*H01L 21/00* (2006.01)
*H01L 21/4763* (2006.01)
*H01L 21/44* (2006.01)

(52) U.S. Cl. ........ 438/106; 438/109; 438/112; 438/629; 438/667; 257/E21.499; 257/E21.506

(58) Field of Classification Search ............... 438/106, 438/109, 112, 629, 667; 257/E21.499, E21.506
See application file for complete search history.

(56) References Cited

U.S. PATENT DOCUMENTS

| 5,353,498 | A | 10/1994 | Fillion et al. | |
| 6,271,469 | B1 | 8/2001 | Ma et al. | |
| 6,423,570 | B1 * | 7/2002 | Ma et al. | 438/106 |
| 6,911,392 | B2 * | 6/2005 | Bieck et al. | 438/667 |
| 7,078,788 | B2 | 7/2006 | Vu et al. | |
| 7,091,124 | B2 * | 8/2006 | Rigg et al. | 438/667 |
| 7,189,596 | B1 | 3/2007 | Mu et al. | |
| 7,312,405 | B2 * | 12/2007 | Hsu | 174/262 |
| 7,358,603 | B2 * | 4/2008 | Li et al. | 257/698 |
| 7,619,901 | B2 * | 11/2009 | Eichelberger et al. | 361/763 |
| 7,843,052 | B1 * | 11/2010 | Yoo et al. | 257/686 |
| 7,858,441 | B2 * | 12/2010 | Lin et al. | 438/109 |
| 7,888,184 | B2 * | 2/2011 | Shim et al. | 438/122 |
| 8,138,014 | B2 * | 3/2012 | Chi et al. | 438/106 |
| 2010/0013081 | A1 * | 1/2010 | Toh et al. | 257/692 |
| 2010/0133682 | A1 * | 6/2010 | Meyer | 257/698 |

* cited by examiner

*Primary Examiner* — Charles Garber
*Assistant Examiner* — Ron Pompey
(74) *Attorney, Agent, or Firm* — McCracken & Frank LLC

(57) ABSTRACT

The present invention relates to a method for making a stackable package. The method includes the following steps: (a) providing a first carrier; (b) disposing at least one chip on the first carrier; (c) forming a molding compound so as to encapsulate the chip; (d) removing the first carrier; (e) forming a first redistribution layer and at least one first bump; (f) providing a second carrier; (g) disposing on the second carrier; (h) removing part of the chip and part of the molding compound; (i) forming a second redistribution layer; and (j) removing the second carrier. Therefore, the second redistribution layer enables the stackable package to have more flexibility to be utilized.

20 Claims, 11 Drawing Sheets

METHOD FOR MAKING A STACKABLE PACKAGE

BACKGROUND OF THE INVENTION

1. Field of the Invention

The present invention relates to a method for making a stackable package, and more particularly to a method for making a stackable package having a redistribution layer and a through via.

2. Description of the Related Art

FIG. 1 shows a cross-sectional view of a conventional stackable package. The conventional stackable package 1 comprises an interposer 10 and a chip 20. The interposer 10 comprises a body 11, a plurality of through vias 12, a plurality of conductive traces 13, a plurality of pads 14 and a plurality of solder balls 15. The body 11 has a first surface 111 and a second surface 112. The through vias 12 penetrate through the body 11, and are exposed to the first surface 111 and the second surface 112. The conductive traces 13 are disposed on the first surface 111 of the body 11, and electrically connected to the through vias 12. The pads 14 are disposed on the second surface 112 of the body 11, and electrically connected to the through vias 12. The solder balls 15 are disposed on the pads 14. The chip 20 is disposed on the interposer 10. The chip 20 comprises a plurality of chip pads 21 and a plurality of bumps 22. The bumps 22 are disposed between the chip pads 21 and the conductive traces 13, and the chip 20 is electrically connected to the interposer 10 by the bumps 22.

The conventional stacked package 1 has the following disadvantages. The chip 20 of the conventional stacked package 1 is electrically connected to exterior elements by the interposer 10. However, the interposer 10 increases the thickness of the product, and the manufacturing processes of the interposer 10 is too complicated, so that the manufacturing cost is increased. Moreover, the gap between the bumps 22 of the chip 20 is too small, so that an underfill (not shown) is difficult to be formed therein to encapsulate the bumps 22.

Therefore, it is necessary to provide a method for making a stackable package to solve the above problems.

SUMMARY OF THE INVENTION

The present invention is directed to a method for making a stackable package. The method comprises the following steps: (a) providing a first carrier having a surface; (b) disposing at least one chip on a surface of the first carrier, wherein the chip comprises a first surface, a second surface, an active circuit layer and at least one conductive via, the active circuit layer is disposed in the chip and exposed to the second surface, the conductive via is disposed in the chip and connected to the active circuit layer; (c) forming a molding compound on the surface of the first carrier, so as to encapsulate the chip, wherein the molding compound comprises a surface attached to the surface of the first carrier; (d) removing the first carrier, so as to expose the second surface of the chip and the surface of the molding compound; (e) forming a first redistribution layer (RDL) and at least one first bump, wherein the first redistribution layer (RDL) is disposed on the second surface of the chip and the surface of the molding compound, and electrically connected to the conductive via by the active circuit layer, the first bump is disposed on the first redistribution layer (RDL), and electrically connected to the active circuit layer and the conductive via by the first redistribution layer (RDL); (f) providing a second carrier; (g) disposing a surface of the first redistribution layer (RDL) on the second carrier; (h) removing part of the chip and part of the molding compound, so as to expose the conductive via to the first surface of the chip, and form a through via; (i) forming a second redistribution layer (RDL) on the first surface of the chip, wherein the second redistribution layer (RDL) is electrically connected to the through via; and (j) removing the second carrier.

The present invention is further directed to a method for making a stackable package. The method comprises the following steps: (a) providing a first carrier having a surface; (b) disposing at least one chip on a surface of the first carrier, wherein the chip comprises a first surface, a second surface and an active circuit layer, the active circuit layer is disposed in the chip and exposed to the second surface; (c) forming a molding compound on the surface of the first carrier, so as to encapsulate the chip, wherein the molding compound comprises a surface attached to the surface of the first carrier; (d) removing the first carrier, so as to expose the second surface of the chip and the surface of the molding compound; (e) forming a first redistribution layer (RDL) and at least one first bump, wherein the first redistribution layer (RDL) is disposed on the second surface of the chip and the surface of the molding compound, and electrically connected to the active circuit layer, the first bump is disposed on the first redistribution layer (RDL), and electrically connected to the active circuit layer by the first redistribution layer (RDL); (f) providing a second carrier; (g) disposing a surface of the first redistribution layer (RDL) on the second carrier; (h) removing part of the chip and part of the molding compound; (i) forming at least one through via in the chip, wherein the through via is connected to the active circuit layer and exposed to the first surface of the chip; (j) forming a second redistribution layer (RDL) on the first surface of the chip, wherein the second redistribution layer (RDL) is electrically connected to the through via; and (k) removing the second carrier.

Therefore, the second redistribution layer enables the stackable package to have more flexibility to be utilized. Moreover, the through via is formed in the chip, and electrically connected to the first redistribution layer (RDL), and an extra element is unnecessary. As a result, the manufacturing cost and the size of the product are reduced.

DETAILED DESCRIPTION OF THE INVENTION

Figure 1:
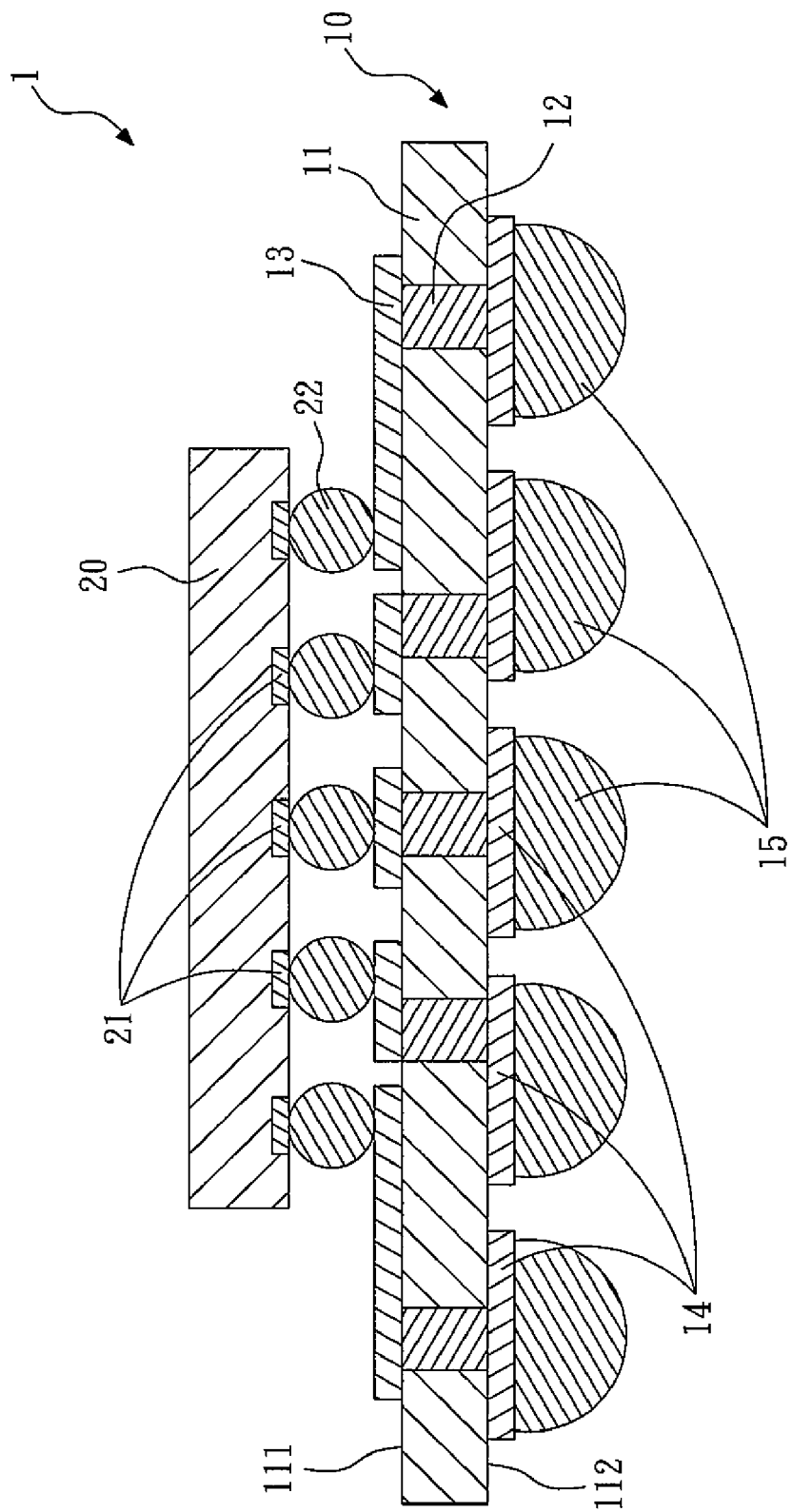
FIG. 1 is a cross-sectional view of a conventional stackable package.
Figure 2:
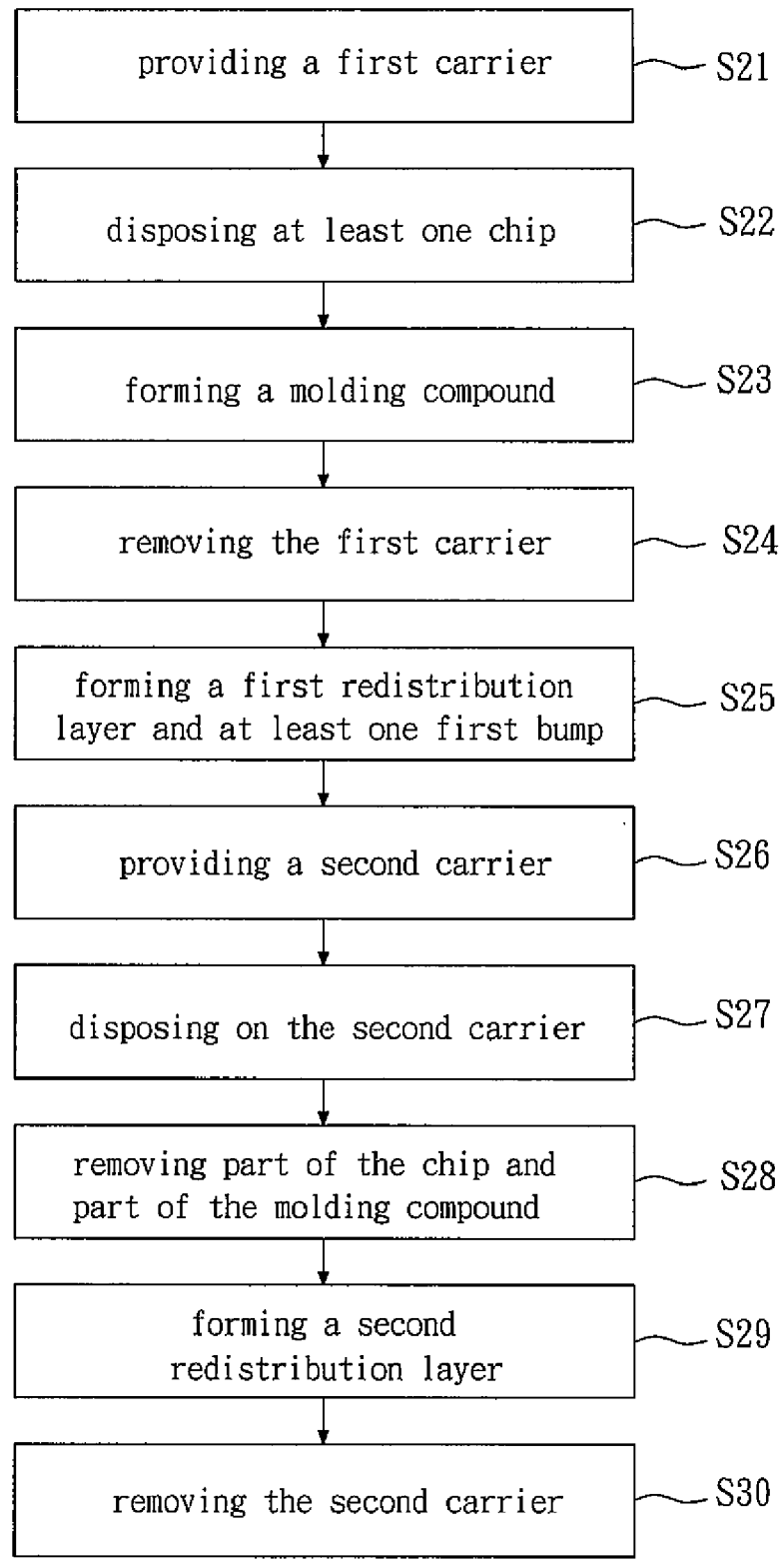
FIG. 2 is a flow chart of a method for making a stackable package according to a first embodiment of the present invention.
Figure 3:
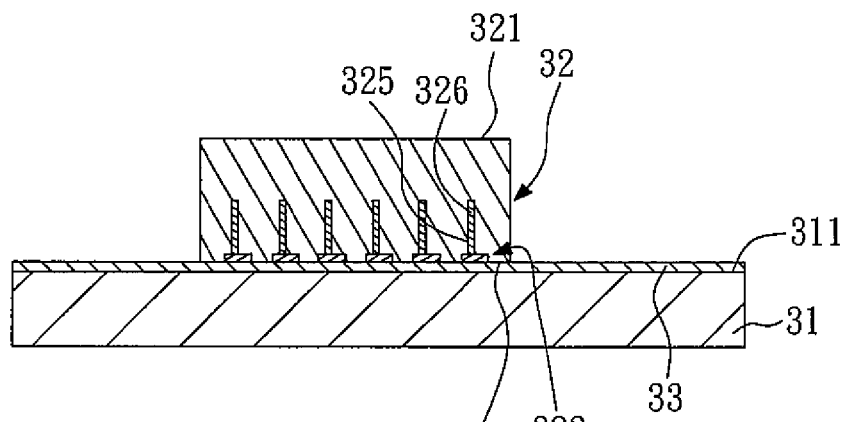
FIGS. 3 to 9 are schematic views of the method for making a stackable package according to the first embodiment of the present invention.

FIG. 2 shows a flow chart of a method for making a stackable package according to a first embodiment of the present invention. First, as shown in FIG. 3 and step S21, a first carrier 31 is provided. The first carrier 31 has a surface 311. As shown in step S22, at least one chip 32 is disposed on the surface 311 of the first carrier 31. The chip 32 comprises a first surface 321, a second surface 322, an active circuit layer 323 and at least one conductive via 326. The active circuit layer 323 is disposed in the chip 32, and exposed to the second surface 322. The conductive via 326 is disposed in the chip 32, and connected to the active circuit layer 323.

In this embodiment, the chip 32 is a known-good die, and the second surface 322 of the chip 32 is adhered to the surface 311 of the first carrier 31 by an adhesive 33. Moreover, the chip 32 further comprises at least one hole 325. The conductive via 326 comprises a first insulating layer (not shown) and a conductor (not shown). The first insulating layer is disposed on a side wall of the hole 325, and defines a first groove (not shown). The conductor fills up the first groove. However, in other embodiments, a second chip (not shown) can be disposed side by side with the chip 32 on the surface 311 of the first carrier 31, and the second chip is also a known-good die. It is understood that, the form of the second chip has no limitation, and the second chip can comprise a conductive via or not. Moreover, the conductive via 326 can further comprise a second insulating layer (not shown). The conductor is only disposed on a side wall of the first groove, and defines a second groove (not shown), and the second insulating layer fills up the second groove. In the present invention, only when the chip 32 is a known-good die, the chip 32 can be disposed on the first carrier 31, therefore the yield rate is increased.

Figure 4:
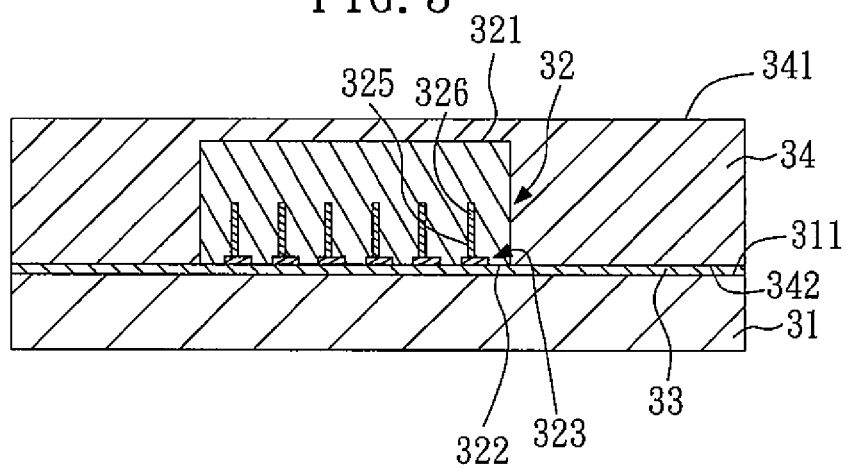

As shown in FIG. 4 and step S23, a molding compound 34 is formed on the surface 311 of the first carrier 31, so as to encapsulate the chip 32. The molding compound 34 comprises a second surface 342 attached to the surface 311 of the first carrier 31. In this embodiment, the second surface 342 of the molding compound 34 is level with the second surface 322 of the chip 32. The molding compound 34 is used as a support of the chip 32, so as to increase the thickness and the strength of the chip 32. Therefore, a first surface 341 of the molding compound 34 is used as a supporting surface of the following manufacturing process, so as to facilitate processing the second surface 322 of the chip 32.

Figure 5:
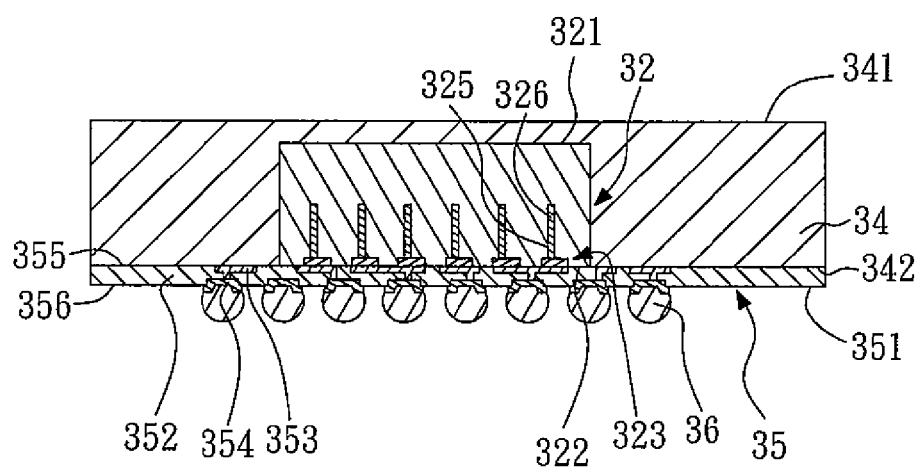

As shown in FIG. 5 and step S24, the first carrier 31 is removed, preferably, the adhesive 33 is removed at the same time, so as to expose the second surface 322 of the chip 32 and the second surface 342 of the molding compound 34. Meanwhile, the molding compound 34 is used as a support of the chip 32, therefore a first redistribution layer (RDL) 35 and at least one first bump 36 are formed, and another carrier is not needed, as shown in step S25. The first redistribution layer (RDL) 35 is disposed on the second surface 322 of the chip 32 and the second surface 342 of the molding compound 34, and electrically connected to the conductive via 326 by the active circuit layer 323. The first bump 36 is disposed on the first redistribution layer (RDL) 35, and electrically connected to the active circuit layer 323 and the conductive via 326 by the first redistribution layer (RDL) 35.

In this embodiment, the first redistribution layer (RDL) 35 comprises to a protective layer 352, a first circuit layer 353 and an under ball metal layer (UBM) 354. The first circuit layer 353 is disposed in the protective layer 352. The protective layer 352 has a first surface 355 and a second surface 356. The second surface 356 has at least one second opening, so as to expose part of the first circuit layer 353. The under ball metal layer (UBM) 354 is disposed in the second opening, and electrically connected to the first circuit layer 353. The first bump 36 is disposed on the under ball metal layer (UBM) 354. Therefore, the first redistribution layer (RDL) 35 is used to re-distribute the position of the under ball metal layer (UBM) 354 and the first bump 36, to match the position of electrical contact points of other package. As a result, the stackable package 2 (FIG. 9) made by the method according to the present invention is more flexible in application.

Figure 6:
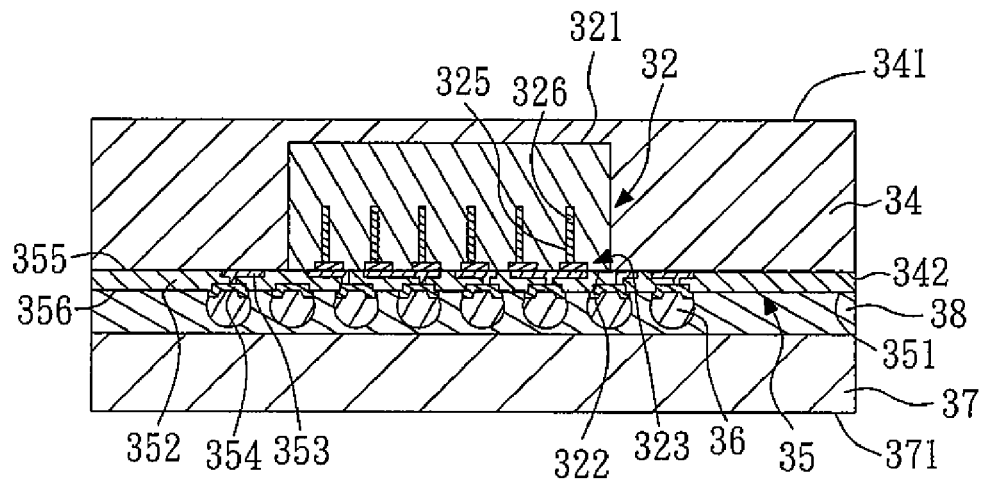

As shown in FIG. 6 and step S26, a second carrier 37 is provided. As shown in step S27, a surface 351 of the first redistribution layer (RDL) 35 is disposed on the second carrier 37 by a glue layer 38, and the glue layer 38 encapsulates the first bump 36. In this embodiment, the glue layer 38 is a peelable glue layer, and formed by spin coating. Therefore, the glue layer 38 protects the first bump 36, and the second carrier 37 is used as a support of the first redistribution layer (RDL) 35. Therefore, a surface 371 of the second carrier 37 is used as a supporting surface of the following manufacturing process, so as to facilitate processing the first surface 341 of the molding compound 34.

Figure 7:
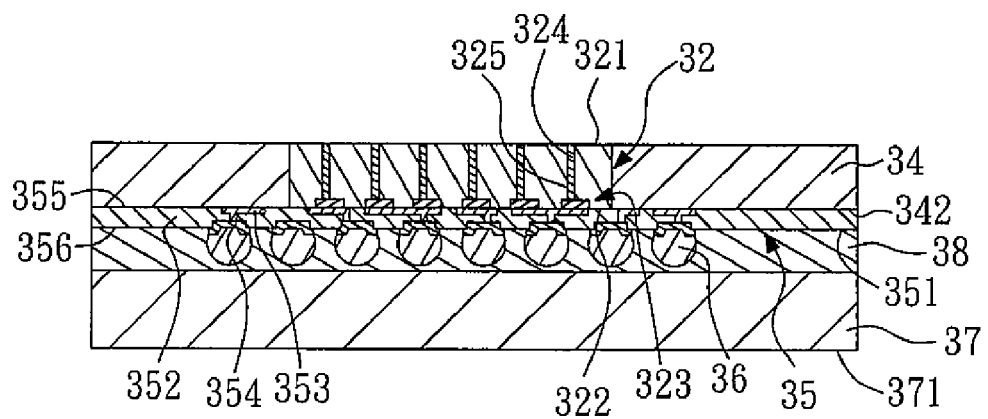

As shown in FIG. 7 and step S28, part of the chip 32 and part of the molding compound 34 are removed, so as to expose the conductive via 326 (FIG. 6) to the first surface 321 of the chip 32, and a through via 324 is formed. That is, the conductive via 326 is substantially the same as the through via 324, and the difference between the conductive via 326 and the through via 324 is that the through via 324 is exposed to the first surface 321 of the chip 32. In this embodiment, the first surface 321 of the chip 32 and part of the first surface 341 of the molding compound 34 are ground first, and then trimmed by chemical-mechanical polishing (CMP). However, in other embodiments, part of the chip 32 and part of the molding compound 34 can be removed only by chemical-mechanical polishing (CMP). In this embodiment, part of the through via 324 is exposed to the first surface 321 of the chip 32, and forms a contact point.

Figure 8:
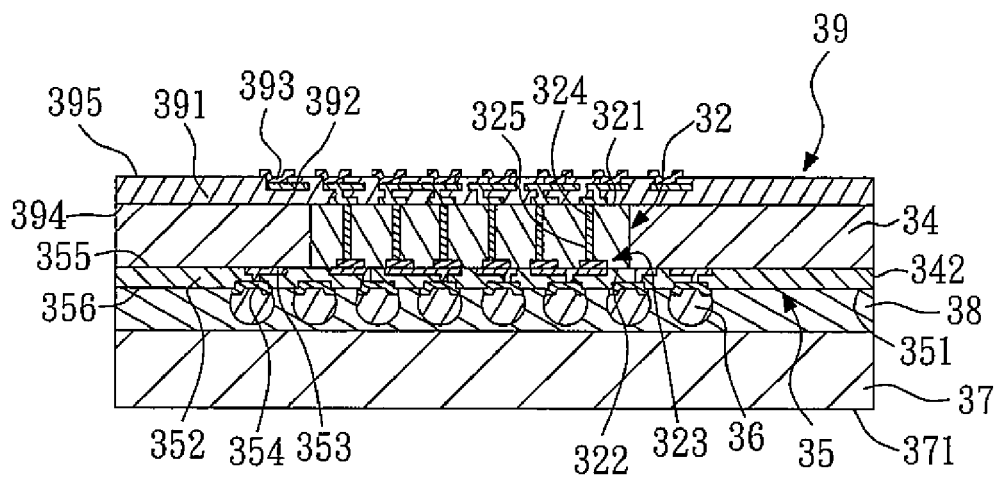

As shown in FIG. 8 and step S29, a second redistribution layer (RDL) 39 is formed on the first surface 321 of the chip 32. The second redistribution layer (RDL) 39 is electrically connected to the through via 324. In this embodiment, the second redistribution layer (RDL) 39 comprises a protective layer 391, a second circuit layer 392 and an under ball metal layer (UBM) 393. The second circuit layer 392 is disposed in the protective layer 391. The protective layer 391 has a first surface 394 and a second surface 395. The second surface 395 has at least one second opening, so as to expose part of the second circuit layer 392. The under ball metal layer (UBM) 393 is disposed in the second opening, and electrically connected to the second circuit layer 392. Therefore, the second redistribution layer (RDL) 39 is used to re-distribute the position of the contact point of the through via 324, to match the position of electrical contact points of other package. As a result, the stackable package 2 (FIG. 9) made by the method according to the present invention is more flexible in application.

Figure 9:
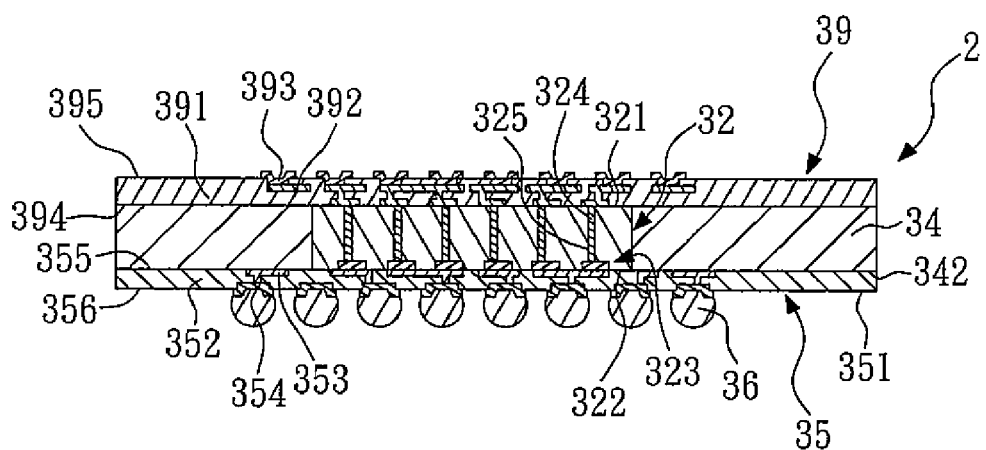

As shown in FIG. 9 and step S30, the second carrier 37 and the glue layer 38 are removed, and meanwhile, the stackable package 2 according to the present invention is formed. Preferably, the glue layer 38 can choose to be softened by heated or under ultraviolet ray according to the characteristic of the material of the glue layer 38, so as to remove the glue layer 38. In this embodiment, the glue layer 38 is a peelable material with better thermoplasticity, so that the glue layer 38 can be softened by heating, so as to remove the glue layer 38. However, in other embodiments, the glue layer 38 can be a material that can be softened under ultraviolet ray, so that the glue layer 38 can be softened by providing ultraviolet ray, so as to remove the glue layer 38. Therefore, the glue layer 38 protects the first bump 36 during the manufacturing process.

Figure 10:
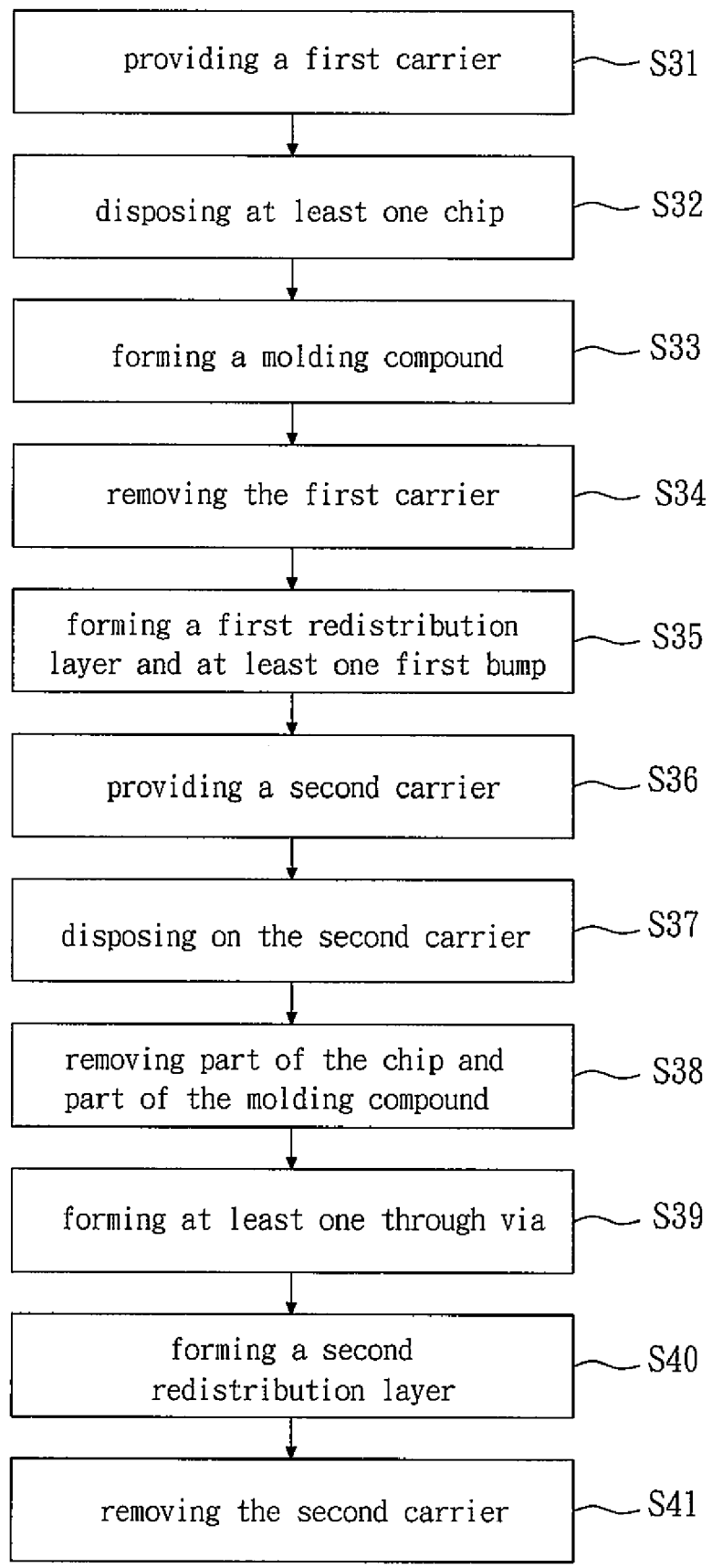
FIG. 10 is a flow chart of a method for making a stackable package according to a second embodiment of the present invention.

FIG. 10 shows a flow chart of a method for making a stackable package according to a second embodiment of the present invention. FIGS. 11 to 18 show schematic views of the method for making a stackable package according to the second embodiment of the present invention. The method for making a stackable package according to the second embodiment is substantially the same as the method for making a stackable package according to the first embodiment (FIGS. 3 to 9), and the same elements are designated by the same reference numbers.

Figure 11:
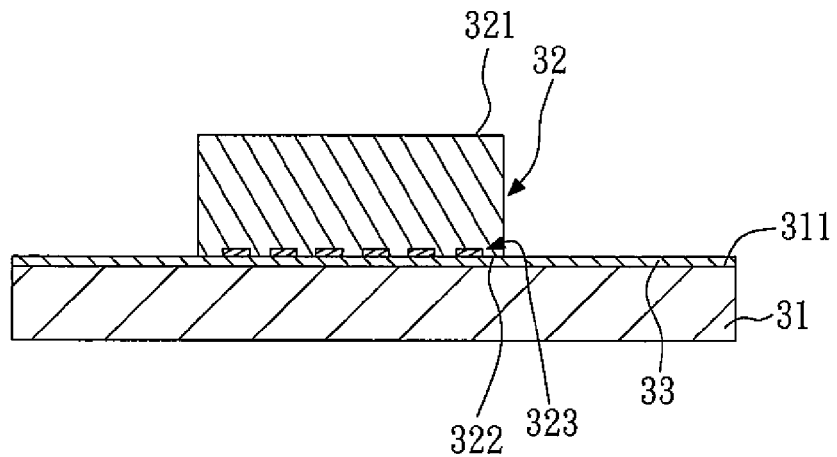
FIGS. 11 to 18 are schematic views of the method for making a stackable package according to the second embodiment of the present invention.
Figure 12:
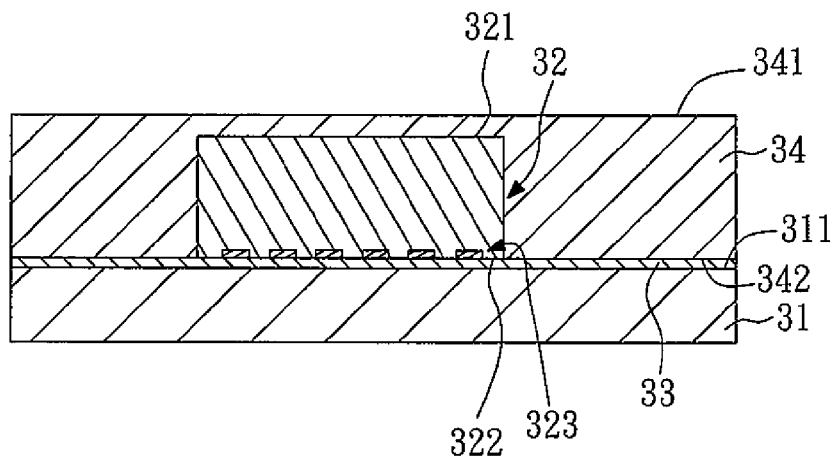
Figure 13:
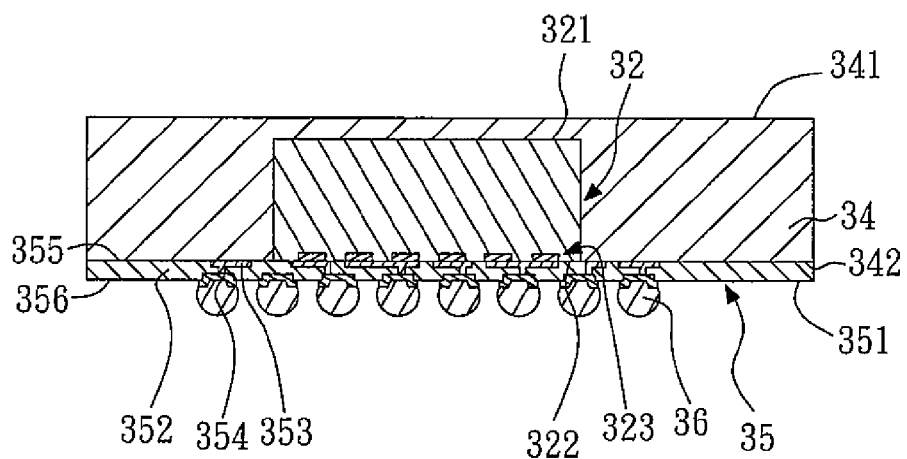
Figure 14:
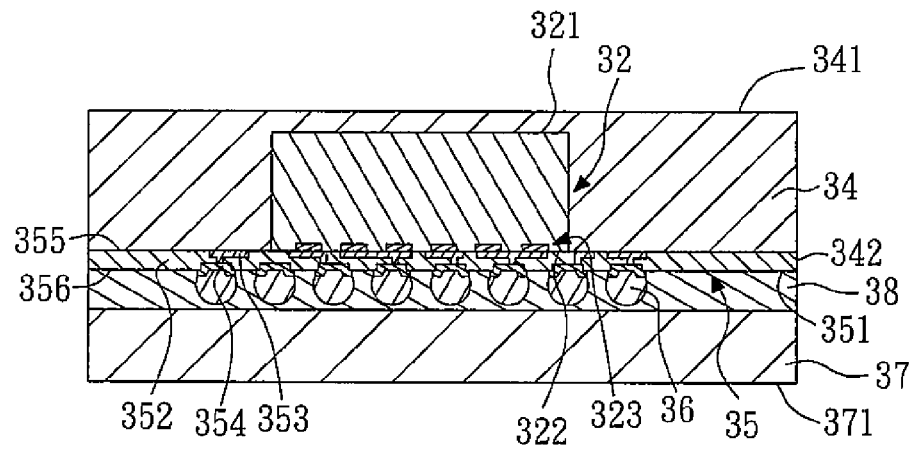
Figure 15:
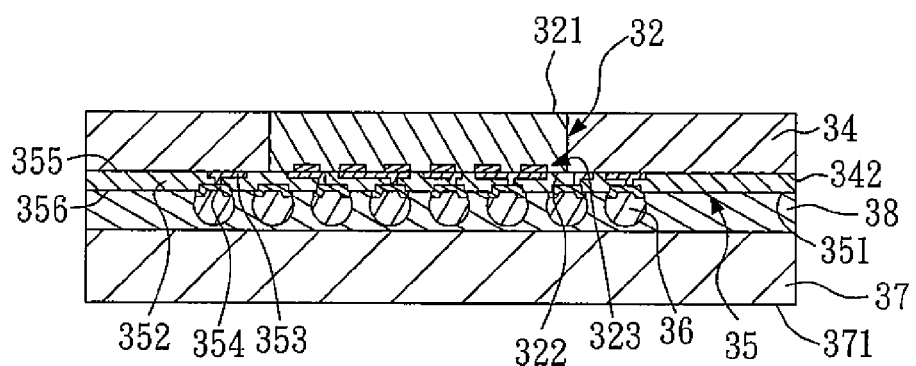

The difference between the method according to the second embodiment and the method according to the first embodiment is that after the first carrier 31 is provided (step S31), the chip 32, which does not comprise the conductive via 326 as shown in FIG. 11, is disposed on the surface 311 of the first carrier 31 (step S32). Then, the same processes as the method according to the first embodiment are conducted, that is, as shown in FIG. 12, the molding compound 34 are formed (step S33). Then, as shown in FIG. 13, the first carrier 31 is removed (step S34). Meanwhile, the molding compound 34 is used as a support of the chip 32, therefore the first redistribution layer (RDL) 35 and the first bump 36 are formed (step S35), and another carrier is not needed. Then, as shown in FIG. 14, the second carrier 37 is provided (step S36), and the surface 351 of the first redistribution layer (RDL) 35 is disposed on the second carrier 37 by the glue layer 38 (step S37). Then, as shown in FIG. 15, part of the chip 32 and part of the molding compound 34 (step S38) are removed.

Figure 16:
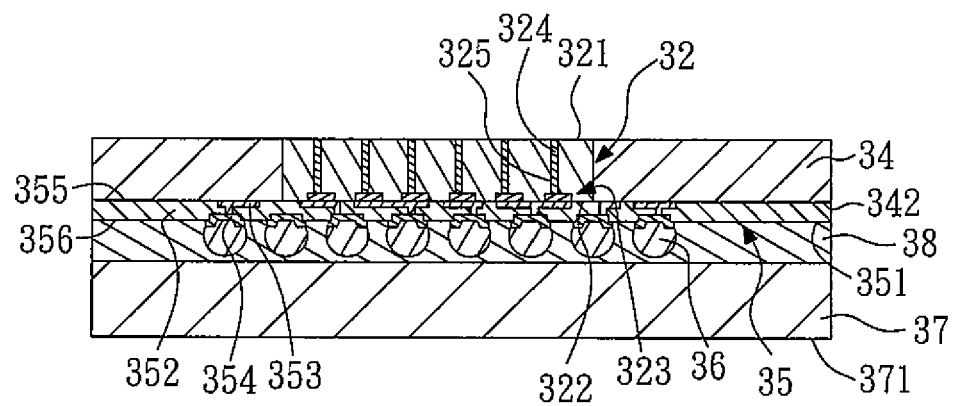
Figure 17:
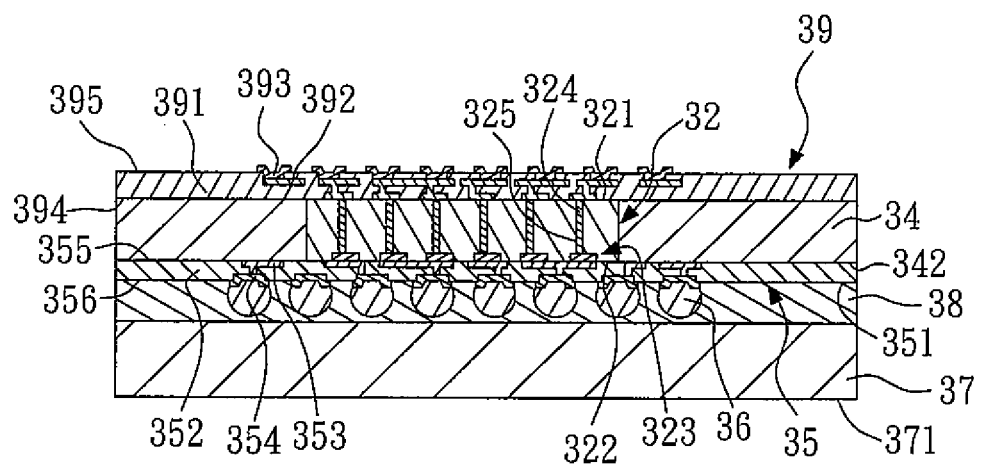
Figure 18:
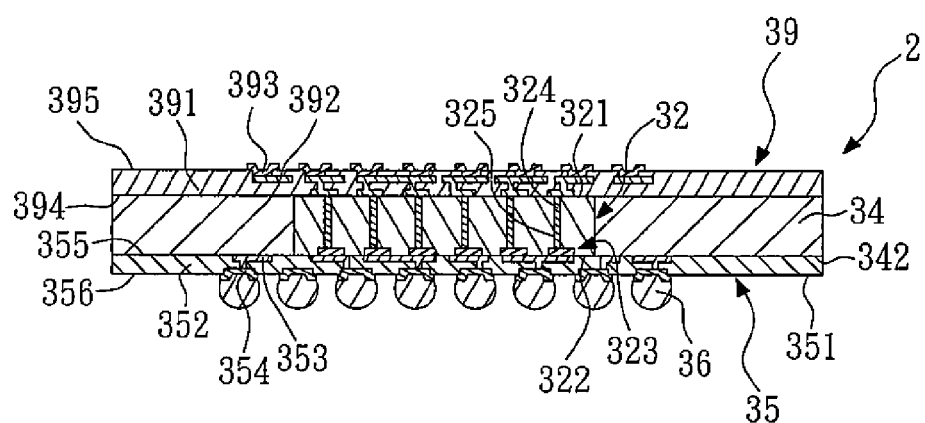

Then, as shown in FIG. 16, a through via 324 is formed in the chip 32 (step S39). The through via 324 is connected to the active circuit layer 323, and exposed to the first surface 321 of the chip 32. In the end, the same processes as the method according to the first embodiment are conducted, that is, as shown in FIG. 17, the second redistribution layer (RDL) 39 is formed (step S40). Then, as shown in FIG. 18, the second carrier 37 and the glue layer 38 are removed (step S41), so as to form the stackable package 2 according to the present invention.

Figure 19:
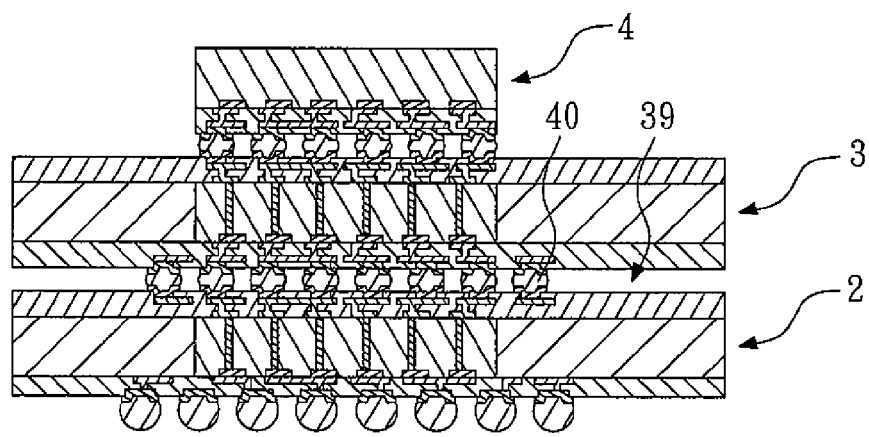
FIGS. 19 to 20 are schematic views showing the application of a stackable package according to the present invention.
Figure 20:
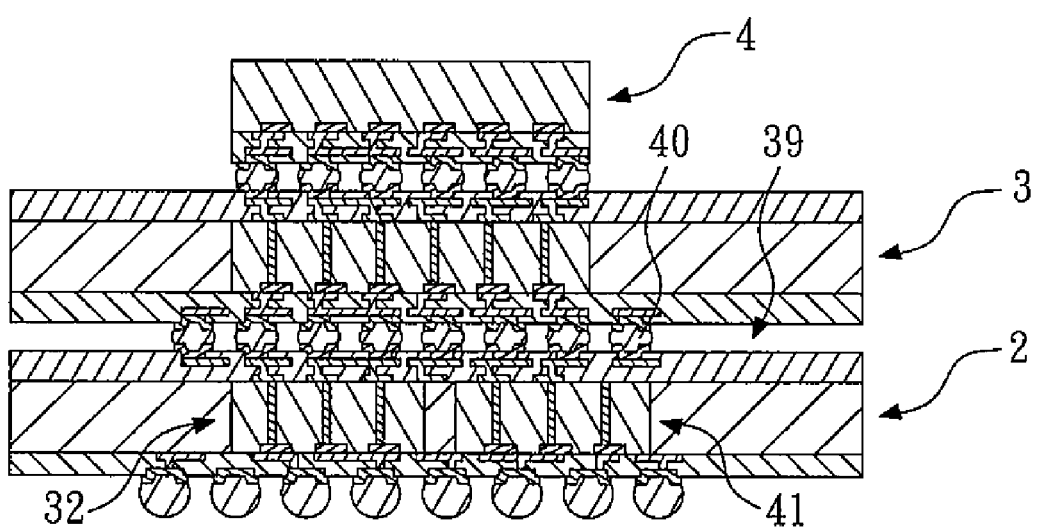

Moreover, as shown in FIG. 19, after the stackable package 2 according to the present invention is formed, a second package 3 is further stacked on the stackable package 2, so as to form a double-layered stacked package. It is understood that, at least one conductive element (for example, a second bump 40) is disposed between and electrically connects the second package 3 and the second redistribution layer (RDL) 39 of the stackable package 2. Preferably, a third package 4 can be further stacked on the second package 3, so as to form a third-layered stacked package. Preferably, the stackable package 2 is a processor, the second package 3 is a radio frequency (RF) device, and the third package 4 is a memory. However, in other embodiments, as shown in FIG. 20, the stackable package 2 can further comprise a second chip 41 disposed side by side with the chip 32, and the second chip 41 is also a known-good die. The form of the second chip 41 has no limitation, and the second chip 41 can comprise a conductive via or not.

Therefore, the second redistribution layer (RDL) 39 is used to re-distribute the position of the contact point of the through via 324, to match the position of electrical contact points of other package. As a result, the stackable package 2 (FIG. 9) made by the method according to the present invention is more flexible in application, for example, the stackable package 2 according to the present invention can be applied to the three following situation. First, the molding compound 34 of the stackable package 2 encapsulates a plurality of chips 32, and after another package having the same size of the stackable package 2 is stacked thereon, a singulation process is conducted. Second, the molding compound 34 of the stackable package 2 encapsulates a plurality of chips 32, and after a plurality of chips are stacked thereon, a singulation process is conducted. Third, a singulation process is conducted to the stackable package 2 first, and then, another chip is stacked thereon. Moreover, the through via 324 is formed in the chip 32, and electrically connected to the first redistribution layer (RDL) 35, and an extra element is unnecessary. As a result, the manufacturing cost and the size of the product are reduced.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A method for making a stackable package, comprising:
   (a) providing a first carrier having a surface;
   (b) disposing at least one chip on a surface of the first carrier, wherein the chip comprises a first surface, a second surface, an active circuit layer and at least one conductive via, the active circuit layer is disposed in the chip and exposed to the second surface, the conductive via is disposed in the chip and connected to the active circuit layer;
   (c) forming a molding compound on the surface of the first carrier, so as to encapsulate the chip, wherein the molding compound comprises a surface attached to the surface of the first carrier;
   (d) removing the first carrier, so as to expose the second surface of the chip and the surface of the molding compound;
   (e) forming a first redistribution layer (RDL) and at least one first bump, wherein the first redistribution layer (RDL) is disposed on the second surface of the chip and the surface of the molding compound, and electrically connected to the conductive via by the active circuit layer, the first bump is disposed on the first redistribution layer (RDL), and electrically connected to the active circuit layer and the conductive via by the first redistribution layer (RDL);
   (f) providing a second carrier;
   (g) disposing a surface of the first redistribution layer (RDL) on the second carrier;
   (h) removing part of the chip and part of the molding compound, so as to expose the conductive via to the first surface of the chip, and form a through via;
   (i) forming a second redistribution layer (RDL) on the first surface of the chip, wherein the second redistribution layer (RDL) is electrically connected to the through via; and
   (j) removing the second carrier.

2. The method as claimed in claim 1, wherein in the step (b), the chip is adhered to the surface of the first carrier by an adhesive, and in the step (d), the method further comprises a step of removing the adhesive.

3. The method as claimed in claim 1, wherein in the step (g), the surface of the first redistribution layer (RDL) is disposed on the second carrier by a glue layer, and the glue layer encapsulates the first bump, and in the step (j), the method further comprises a step of removing the glue layer.

4. The method as claimed in claim 3, wherein in the step (g), the glue layer is formed by spin coating.

5. The method as claimed in claim 3, wherein in step (j), the glue layer is softened by heated or under ultraviolet ray, so as to remove the glue layer.

6. The method as claimed in claim 1, wherein in the step (h), part of the chip and part of the molding compound are removed by grinding or chemical-mechanical polishing (CMP).

7. The method as claimed in claim 1, further comprising a step of stacking another package on the second redistribution layer (RDL) after the step (j).

8. The method as claimed in claim 1, wherein in the step (b), the chip is a known-good die.

9. The method as claimed in claim 1, wherein in the step (b), the chip further comprises at least one hole, the conductive via comprises a first insulating layer and a conductor, the first insulating layer is disposed on a side wall of the hole and defines a first groove, and the conductor fills up the first groove.

10. The method as claimed in claim 1, wherein in the step (b), the chip further comprises at least one hole, the conductive via comprises a first insulating layer, a conductor and a second insulating layer, the first insulating layer is disposed on a side wall of the hole and defines a first groove, the conductor is only disposed on a side wall of the first groove and defines a second groove, and the second insulating layer fills up the second groove.

11. The method as claimed in claim 1, wherein in the step (b), a second chip is disposed side by side with the chip on the surface of the first carrier.

12. The method as claimed in claim 11, wherein the second chip is a known-good die.

13. The method as claimed in claim 11, wherein the second chip comprise a conductive via.

14. The method as claimed in claim 11, wherein in the step (c), the molding compound comprises a first surface and a second surface attached to the surface of the first carrier.

15. The method as claimed in claim 14, wherein the second surface of the molding compound is level with the second surface of the chip.

16. The method as claimed in claim 1, wherein in the step (e), the first redistribution layer comprises a protective layer, a first circuit layer and an under ball metal layer (UBM), the first circuit layer is disposed in the protective layer, the protective layer has a first surface and a second surface, the second surface has at least one second opening, so as to expose part of the first circuit layer, the under ball metal layer (UBM) is disposed in the second opening, and electrically connected to the first circuit layer, and the first bump is disposed on the under ball metal layer (UBM).

17. The method as claimed in claim 3, wherein the glue layer is a peelable glue layer.

18. The method as claimed in claim 1, wherein in the step (h), the first surface of the chip and part of the first surface of the molding compound are ground first, and then trimmed by chemical-mechanical polishing (CMP).

19. The method as claimed in claim 1, wherein in the step (h), part of the chip and part of the molding compound is removed only by chemical-mechanical polishing (CMP).

20. The method as claimed in claim 1, wherein in the step (i), the second redistribution layer (RDL) comprises a protective layer, a second circuit layer and an under ball metal layer (UBM), the second circuit layer is disposed in the protective layer, the protective layer has a first surface and a second surface, the second surface has at least one second opening, so as to expose part of the second circuit layer, the under ball metal layer (UBM) is disposed in the second opening, and electrically connected to the second circuit layer.

\* \* \* \* \*